United States Patent
Yang et al.

(10) Patent No.: US 8,644,071 B2
(45) Date of Patent: Feb. 4, 2014

(54) FLASH MEMORY APPARATUS CAPABLE OF EXTENDING DATA RETENTION AND IMPROVING DATA RELIABILITY, AND METHOD FOR CONTROLLING THE SAME

(71) Applicant: Silicon Motion, Inc., Jhubei (TW)

(72) Inventors: Tsung-Chieh Yang, Hsinchu (TW); Ching-Hui Lin, Taipei (TW); Yang-Chih Shen, Taipei (TW); Chun-Chieh Kuo, Taipei (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 13/658,086

(22) Filed: Oct. 23, 2012

(65) Prior Publication Data

US 2013/0107625 A1    May 2, 2013

(30) Foreign Application Priority Data

Oct. 27, 2011    (TW) .............................. 100139062 A (51) Int. Cl.
*G11C 16/06*    (2006.01)

(52) U.S. Cl.
USPC ............ 365/185.09; 365/185.03; 365/185.22; 365/185.33

(58) Field of Classification Search
USPC ............. 365/185.02, 185.03, 185.09, 185.22, 365/185.18, 185.33, 185.29
See application file for complete search history.

(56) References Cited

U.S. PATENT DOCUMENTS

2011/0138111 A1*    6/2011    Kim et al. ..................... 711/103

* cited by examiner

*Primary Examiner* — Andrew Q Tran
(74) *Attorney, Agent, or Firm* — Wang Law Firm, Inc.; Li K. Wang; Stephen Hsu (57) ABSTRACT

The invention provides a flash memory apparatus. In one embodiment, the flash memory apparatus comprises a flash memory and a flash memory controller. The flash memory comprises a write circuit and a memory cell array comprising a plurality of memory cells, wherein the write circuit is coupled to the memory cell array to write data in the memory cells. The flash memory controller is coupled to the write circuit, obtains a total capacity and a used data amount of the flash memory, and directs the write circuit to perform data writing in a one-bit mode when a ratio of the user data amount to the total capacity is less than a first predetermined value.

26 Claims, 6 Drawing Sheets

FLASH MEMORY APPARATUS CAPABLE OF EXTENDING DATA RETENTION AND IMPROVING DATA RELIABILITY, AND METHOD FOR CONTROLLING THE SAME

CROSS REFERENCE TO RELATED APPLICATIONS

This Application claims the benefit of priority to Taiwan Patent Application No. 100139062, filed on Oct. 27, 2011, the entirety of which is incorporated by reference herein.

BACKGROUND OF THE INVENTION

1. Field of the Invention

The invention relates to flash memories, and more particularly to a control device and a method for extending data retention and improving data reliability of storage units of flash memories.

2. Description of the Related Art

A non-volatile memory is widely used in a plurality of applications, such as solid-state disks (SSD), memory cards, digital cameras, multi-media displayers, cell phones, computers, and other electronic devices.

Figure 1A:
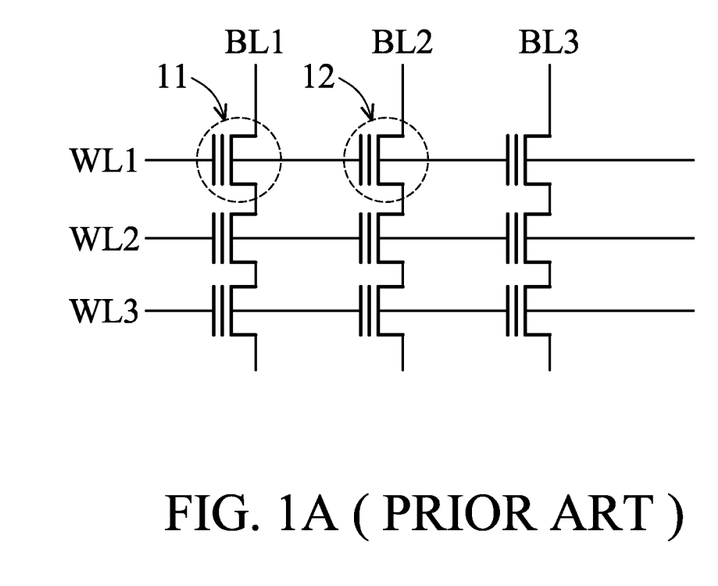
FIG. 1A is a conventional circuit diagram of memory cells of a flash memory.
Figure 1B:
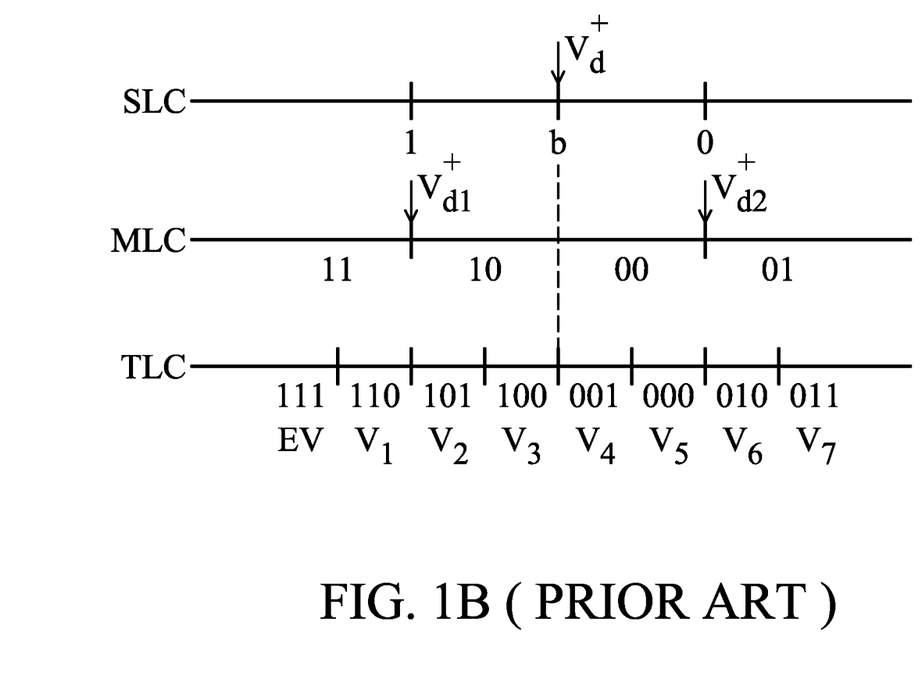
FIG. 1B is a conventional schematic diagram of charge density of a flash memory.

Referring to FIG. 1A, a circuit diagram of memory cells of a flash memory is shown. Referring to FIG. 1B, a schematic diagram of charge density of a flash memory is shown. A single-level-cell (SLC) flash memory comprises a memory cell array comprising a plurality of memory cells. The control gates of a plurality of memory cells located at a single line are coupled to a word line (WL). The sources and drains of a plurality of memory cells located at a single column are coupled together to form a bit line (BL). The memory cells further comprises floating gates for charge storage, and the charge stored in the floating gates does not disappear after a power supply is disconnected.

To determine digital data stored in the memory cells, the charge density distribution of the memory cells is determined. For example, if the charge density of the memory cell 11 is between the levels a and b shown in FIG. 1B, and a measure voltage $V_d^+$ is added to the word line WL1, a current then passes through the bit line BL1, and the data bit stored in the memory cell 11 has a value of "1". Otherwise, if the charge density of the memory cell 12 is between the levels b and c shown in FIG. 1B, a current does not pass through the bit line BL2, and the data bit stored in the memory cell 12 has a value of "0".

A patent application with publication no. US 2011/0138111 A1 discloses a flash memory, wherein 2 data bits are determined according to charge density distribution of memory cells of the flash memory. The difference of the circuit structure between the flash memory and a conventional SLC flash memory is that the flash memory is sequentially measured according to the voltages $V_d^+$, $V_{d1}^+$, and $V_{d2}^+$, and four sets of 2 data bits of (11, 10, 00, 01) are determined from one memory cell. The flash memory is referred to as a multi-level-cell (MLC) flash memory. A triple-level-cell (TLC) flash memory further determines eight sets of 3 data bits of (111, 110, 100, 101, 001, 000, 010, 011) from one memory cell.

The TLC flash memory has a higher data capacity than those of the MLC flash memory and the SLC flash memory. Because the width of the charge distribution of the memory cell of the SLC flash memory is double that of the MLC flash memory and four times that of the TLC flash memory, the SLC flash memory has a smaller measurement error, a higher access speed, and a better data reliability than the MLC flash memory and the TLC flash memory. In other words, the MLC flash memory and the TLC flash memory have lower manufacturing costs than that of the SLC flash memory but have shorter endurance and smaller wear capacity than that of the SLC flash memory.

The conventional flash memory device therefore cannot have all the benefits of a low manufacturing cost, high data capacity, long endurance, and high wear capacity.

BRIEF SUMMARY OF THE INVENTION

The invention provides a flash memory apparatus. In one embodiment, the flash memory apparatus comprises a flash memory and a flash memory controller. The flash memory comprises a write circuit and a memory cell array comprising a plurality of memory cells, wherein the write circuit is coupled to the memory cell array to write data in the memory cells. The flash memory controller is coupled to the write circuit, obtains a total capacity and a used data amount of the flash memory, and directs the write circuit to perform data writing in a one-bit mode when a ratio of the user data amount to the total capacity is less than a first predetermined value.

In one embodiment, the first predetermined value and the second predetermined value are respectively set to be ⅓ and ⅔. Before a flash memory controller writes data, a total capacity and a used data amount of a flash memory are obtained. When a ratio of the used data amount to the total capacity is less than ⅓, a write circuit is directed to write data in a one-bit mode to store 1 data bit (0 or 1) with two voltage operation ranges EV and V1. When the ratio of the used data amount to the total capacity is greater than ⅓ and less than ⅔, the write circuit is directed to write data in a two-bit mode to store 2 data bits (11, 10, 00, or 01) with the four voltage operation ranges EV, V1, V2, and V3. When the ratio of the used data amount to the total capacity is greater than ⅔, the write circuit is directed to write data in a three-bit mode to store 3 data bits (111, 110, 101, 100, 001, 000, 011, or 010) with the eight voltage operation ranges EV and V1~V7.

In one embodiment, a flash memory controller comprises a hot data table for determining whether data to be written to a flash memory is hot data or not. When a host sends hot data to the flash memory controller, because hot data has a high data access frequency, a write circuit is directed to write the hot data to the flash memory according to one-bit mode to extend the life span of the 3-level memory cell. When the host sends cold data to the flash memory controller, because cold data has a low data access frequency, the write circuit is directed to write the cold data to the flash memory according to three-bit mode to reserve memory capacity for additional data. In addition, if a user hopes to extend the life span of the flash memory, the flash memory controller directs the write circuit not to use the three-bit mode to write data. In other words, the write circuit is directed to use only the one-bit mode and the two-bit mode to write data. The use frequency of the voltage operation ranges with a high charge variation level is therefore reduced, and the life span of the memory cells of the flash memory is extended. A user can also use the flash memory controller to direct the write circuit not to use the 2-bit mode to write data.

In another embodiment, when the ratio is less than the first predetermined value, the write circuit is directed to store 1 data bit (0 or 1) in the voltage operation ranges EV and V2. Because the distance between the voltage operation ranges EV and V2 is long, it is easier to differentiate the data bit stored in the voltage operation range EV from that stored in the voltage operation range V2. Similarly, in another embodiment, the write circuit is directed to store 1 data bit (0 or 1) in the voltage operation ranges EV and V3, or V1 and V3. Similarly, in another embodiment, when a 2-bit mode is used, the write circuit is directed to store 2 data bits in four voltage operation ranges selected from 8 voltage operation ranges, such as the voltage operation ranges EV, V2, V4, and V6.

The flash memory controller of the invention can therefore lower the power consumption of the flash memory. The data retention of the flash memory is also extended, and the data reliability of the flash memory is also improved.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
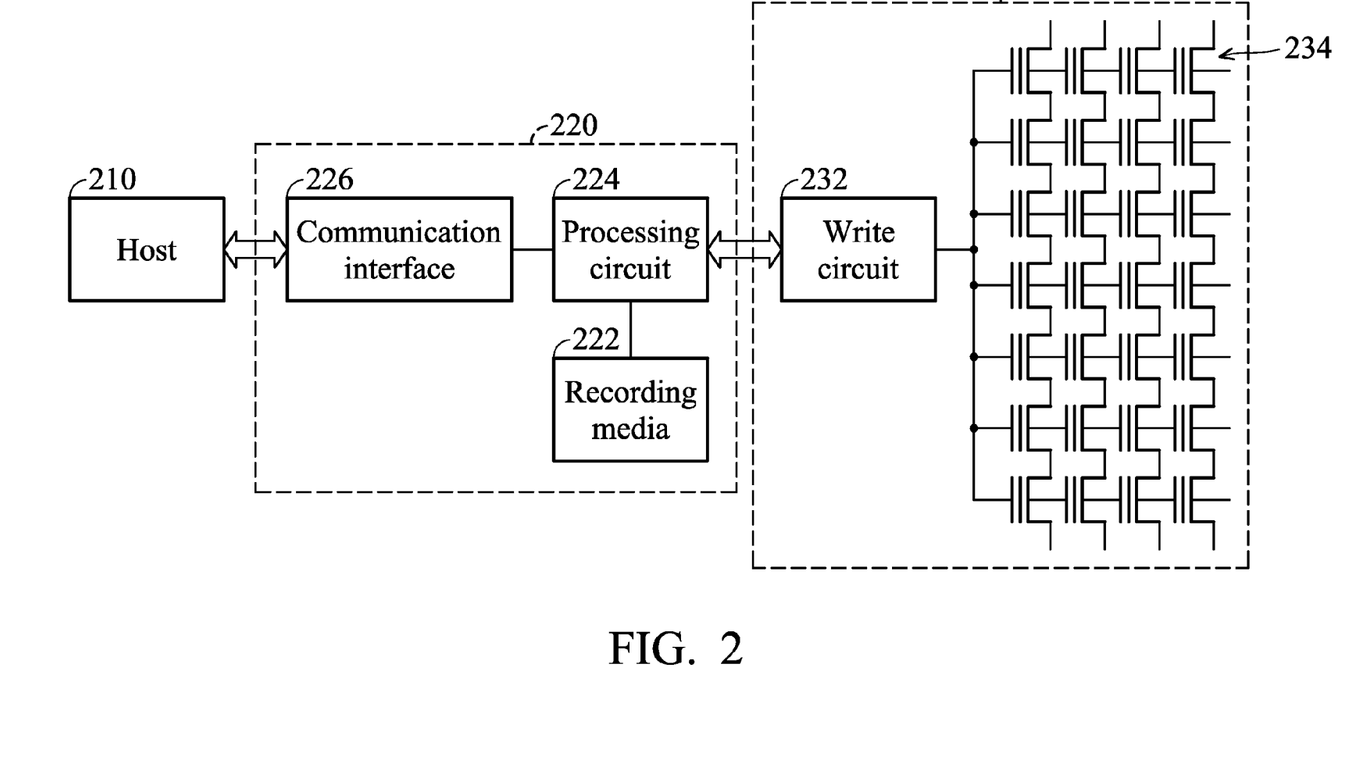
FIG. 2 is a block diagram of a data storage system according to the invention.

Referring to FIG. 2, a block diagram of a data storage system according to the invention is shown. The data storage system comprises a host 210, a flash memory controller 220, and a flash memory 230. The flash memory controller 220 receives data from the host 210 and writes the received data to the flash memory 230. The host 210 is a computer, a card reader, a digital camera, a cell phone, a GPS device, or other electronic apparatus using the flash memory 230 for data storage. The flash memory controller 220 comprises a recording media 222, a processing circuit 224, and a communication interface 226. The communication interface 226 is coupled to the host 210 for data communication between the host 210 and the processing circuit 224. The recording media 222 stores information for the processing circuit 224.

The flash memory 230 comprises a write circuit 232 and a memory cell array 234 comprising a plurality of three level memory cells. The flash memory controller 220 and the flash memory 230 may be integrated into a single memory device, such as a solid state disk (SSD) or a memory card.

Figure 3:
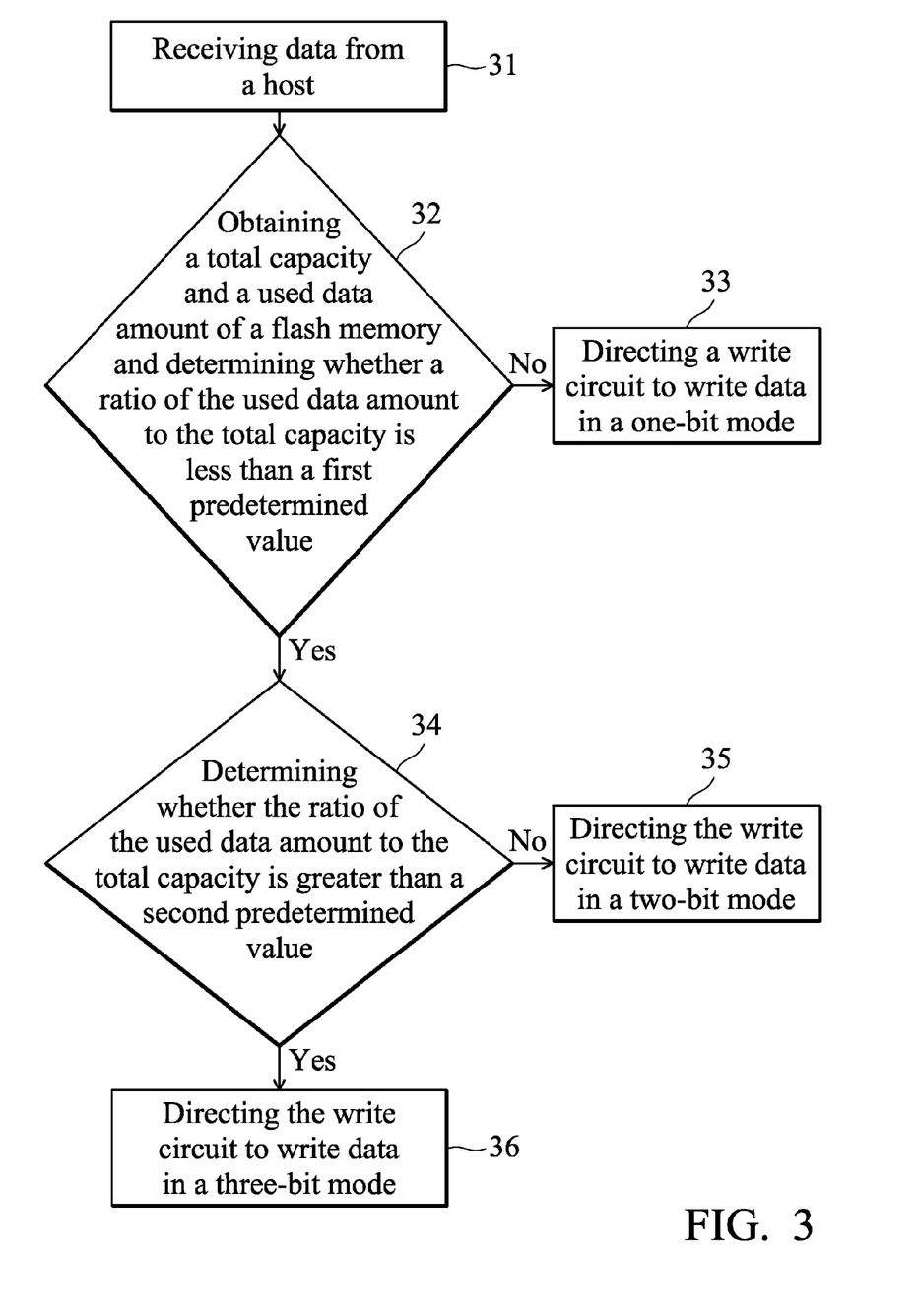
FIG. 3 is a flowchart of a method for writing data to a flash memory according to the invention.

Referring to FIG. 3, a flowchart of a method for writing data to a flash memory according to the invention is shown. First, the flash memory controller 220 receives data from the host 210 via the communication interface 226 (step 31). The processing circuit 224 of the flash memory controller 220 then obtains a total capacity and a used data amount of the flash memory 230, and determines whether a ratio of used data amount to the total capacity is less than a first predetermined value (step 32). When the ratio is less than the first predetermined value, the processing circuit 224 directs a write circuit 232 to write data in a one-bit mode (step 33). When the ratio is equal to or greater than the first predetermined value, the processing circuit 224 determines whether the ratio is greater than a second predetermined value (step 34). When the ratio is less than the second predetermined value, the processing circuit 224 directs the write circuit 232 to write data in a two-bit mode (step 35). When the ratio is equal to or greater than the second predetermined value, the processing circuit 224 directs the write circuit 232 to write data in a three-bit mode (step 36).

Figure 4:
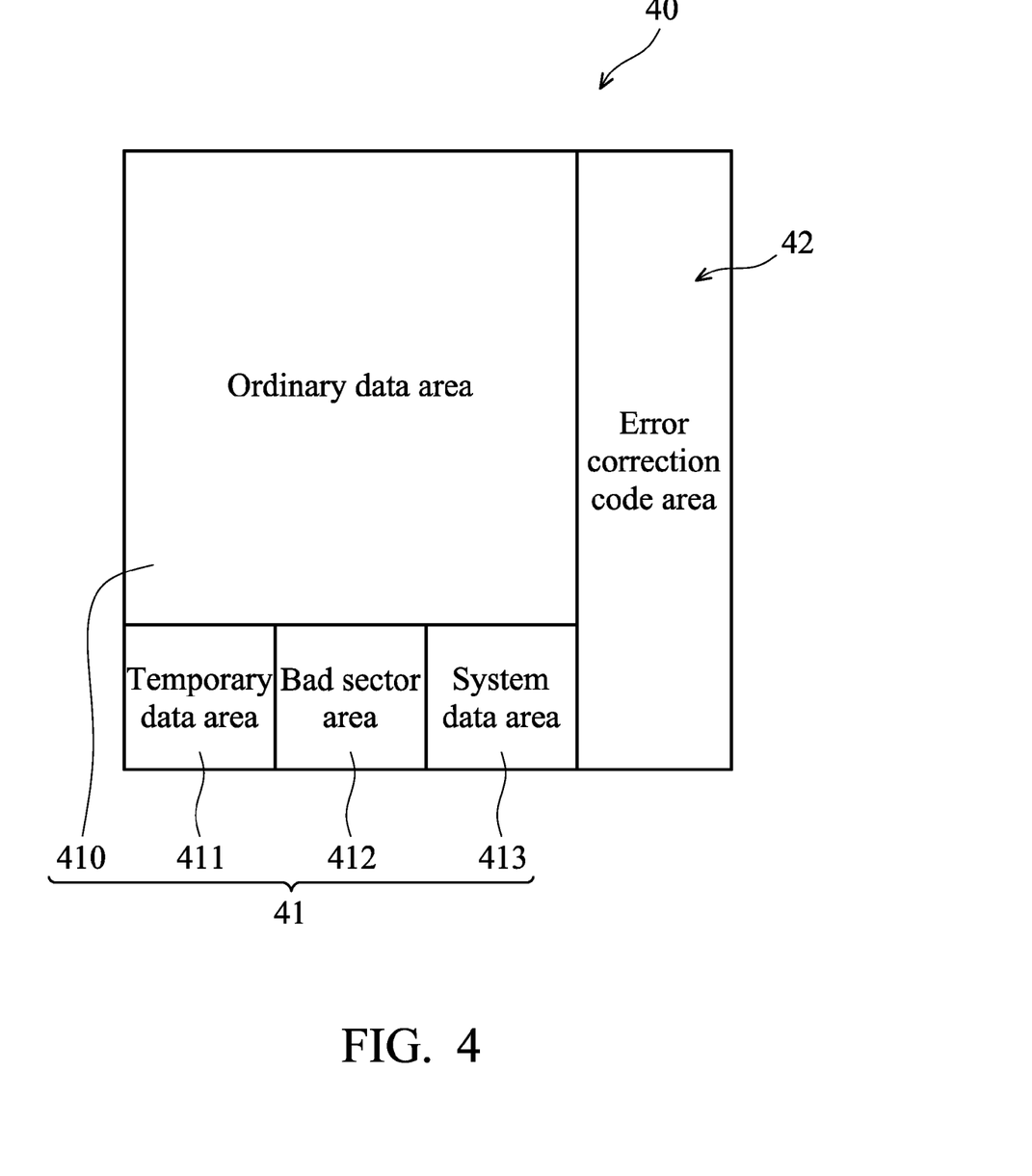
FIG. 4 is a schematic diagram of data stored in a flash memory according to the invention.

Referring to FIG. 4, a schematic diagram of data stored in a flash memory according to the invention is shown. A flash memory 40 comprises an ordinary area 41 and an error correction code area 42. Because a user cannot write data to the error correction code area 42, the total capacity of the flash memory 40 refers to the data capacity of the ordinary area 41. The ordinary area 41 is further divided into an ordinary data area 410, a temporary data area 411, a bad sector area 412, and a system data area 413. The temporary data area 411, the bad sector area 412, and the system data area 413 has a tiny data capacity in comparison with the ordinary data area 410. The total capacity of the flash memory 40 therefore may refer to the capacity of the ordinary area 41, the capacity of the ordinary data area 410, or the capacity of the ordinary data area 410 plus that of the temporary data area 411, the bad sector area 412, or the system data area 413.

Used data refers to data which is stored in a physical layer of a flash memory and can be accessed by a system. On the contrary, invalid data refers to data which is stored in the flash memory but cannot be accessed by the system because a link between a logical address and the invalid data has been deleted. For example, to write first data to a flash memory, a system stores the first data into a first area of the physical layer of the flash memory, and records a link between the first logical address and the first data. When the system wants to access the first data, the system determines the first area in which the first data is stored according to the first logical address, and then reads the first data from the first area. When a user wants to amend the first data, the system stores the amended data in a second area of the physical layer, and then records a link between the first logical address and the amended data. When the system wants to access the amended data, the system determines the second area in which the amended data is stored according to the first logical address, and then reads the amended data from the second area. Because the link between the first logical address and the first data has been deleted, the system cannot access the first data stored in the first area, and the first data is referred to as invalid data. The amended data can be accessed by the system according to the link between the amended data and the first logical address and is referred to as valid data.

Figure 5:
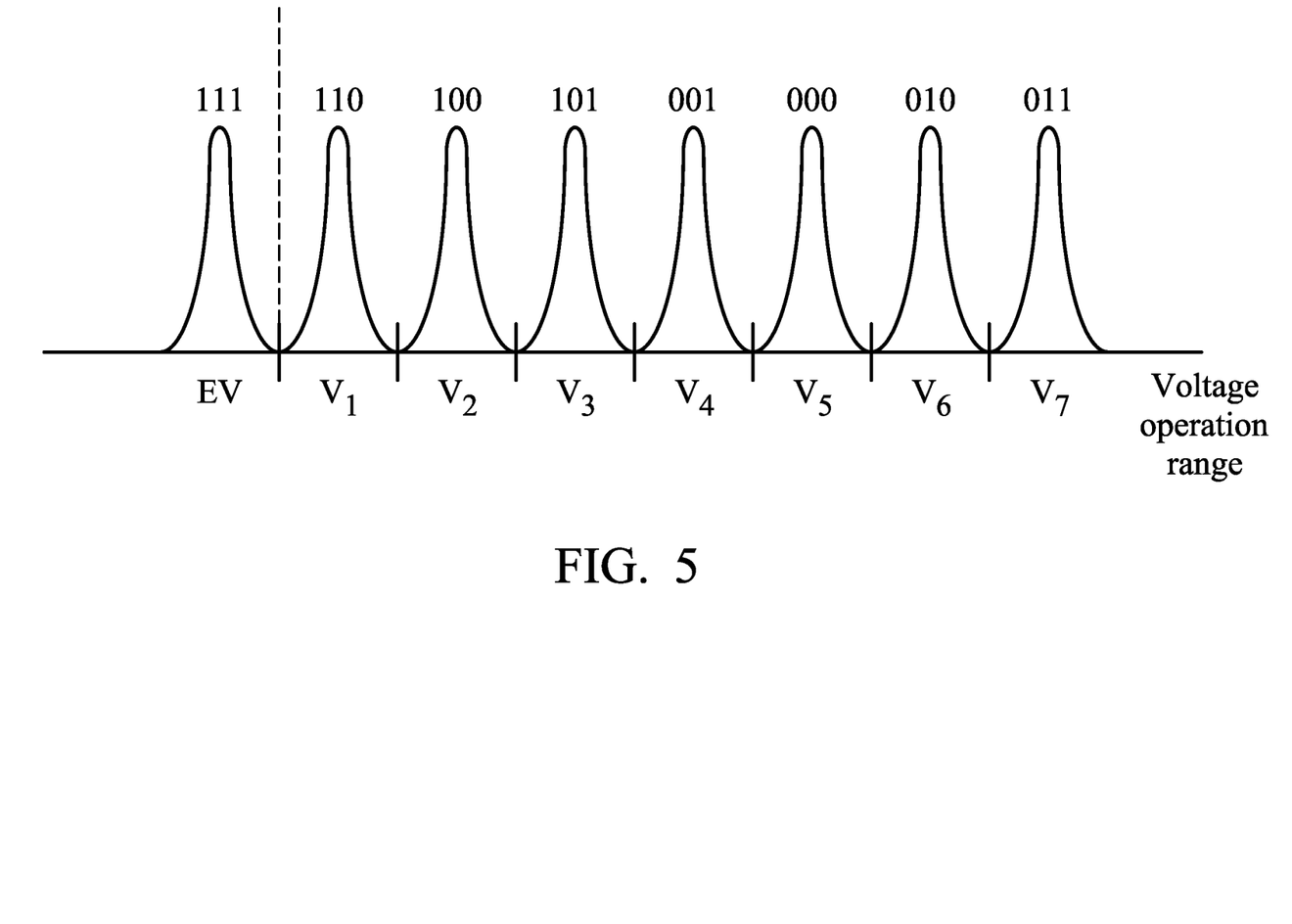
FIG. 5 is a schematic diagram of voltage operation ranges of three-level storage units of a flash memory according to the invention.

Referring to FIG. 5, a schematic diagram of voltage operation ranges of three-level storage units of a flash memory according to the invention is shown. A voltage operation range of a three-level storage unit is divided into an erase threshold voltage interval EV and seven program threshold voltage intervals V1~V7 for storage of three data bits (111, 110, 100, 101, 001, 000, 010, 011). When data is stored into the V1 voltage operation range, the V1 voltage operation range has the smallest charge variation amount in comparison with that of the V7 voltage operation range. Because a flash memory comprises a lot of transistors, whether data is stored in a memory cell is determined according to the charge variation of the transistors. Because the charge variation of the transistors causes damage to a structure of the transistors, the data retention of the flash memory is shortened and the data reliability of the flash memory is lowered when the frequency of the charge variation of the transistors of the flash memory is increased. If data is stored into the V1 voltage operation range shown in FIG. 5, because the V1 voltage operation range has the smallest charge variation amount in comparison with the other voltage operation ranges, the data storage process causes a lowest level of damage to the structure of the memory cell. If data is stored into the V7 voltage operation range as shown in FIG. 5, because the V7 voltage operation range has the greatest charge variation amount in comparison with the other voltage operation ranges, the data storage process causes the highest level of damage to the structure of the memory cell.

An embodiment of the invention is provided. The first predetermined value and the second predetermined value are respectively set to be ⅓ and ⅔. Before the flash memory controller 220 writes data, the total capacity and the used data amount of the flash memory 230 are obtained. When the ratio of the used data amount to the total capacity is less than ⅓, the write circuit 232 is directed to write data in a one-bit mode to store 1 data bit (0 or 1) with the two voltage operation ranges EV and V1. When the ratio of the used data amount to the total capacity is greater than ⅓ and less than ⅔, the write circuit 232 is directed to write data in a two-bit mode to store 2 data bits (11, 10, 00, or 01) with the four voltage operation ranges EV, V1, V2, and V3. When the ratio of the used data amount to the total capacity is greater than ⅔, the write circuit 232 is directed to write data in a three-bit mode to store 3 data bits (111, 110, 101, 100, 001, 000, 011, or 010) with the eight voltage operation ranges EV and V1~V7.

The first predetermined value and the second predetermined value may be adjusted according to user requirement. If the user needs more data buffer blocks to increase data access speed, the system can reserve 10% of data capacity for the data buffer blocks. The first predetermined value and the second predetermined value are then respectively set to be 30% and 60% to increase the efficiency of the data storage.

If a user hopes to extend the life span of the three-level memory cell, the flash memory controller 220 directs the write circuit 232 not to use the three-bit mode to write data. In other words, the write circuit 232 is directed to use only the one-bit mode and the two-bit mode to write data. The use frequency of the voltage operation ranges with a high charge variation level is therefore reduced, and the life span of the memory cells of the flash memory is extended.

A user can also use the flash memory controller 220 to direct the write circuit 232 not to use the 2-bit mode to write data. The flash memory controller 220 further comprises a hot data table for determining whether the data to be written to the flash memory is hot data or not. When the host sends hot data to the flash memory controller, because hot data has a high data access frequency, the write circuit 232 is directed to write the hot data to the flash memory according to one-bit mode to extend the life span of the 3-level memory cell. When the host sends cold data to the flash memory controller, because cold data has a low data access frequency, the write circuit 232 is directed to write the cold data to the flash memory according to three-bit mode to reserve memory capacity for later data.

In another embodiment, when the ratio is less than the first predetermined value, the write circuit 232 is directed to store 1 data bit (0 or 1) in the voltage operation ranges EV and V2. Because the distance between the voltage operation ranges EV and V2 is long, it is easier to differentiate the data bit stored in the voltage operation range EV from that stored in the voltage operation range V2. Similarly, in another embodiment, the write circuit 232 is directed to store 1 data bit (0 or 1) in the voltage operation ranges EV and V3, or V1 and V3.

Similarly, in another embodiment, when a 2-bit mode is used, the write circuit 232 is directed to store 2 data bits in four voltage operation ranges selected from 8 voltage operation ranges, such as the voltage operation ranges EV, V2, V4, and V6.

The flash memory controller of the invention can be used to control an MLC flash memory or a TLC flash memory to achieve the goal of low manufacturing cost and high data capacity. The data retention of the flash memory is extended, and the data reliability of the flash memory is improved.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flash memory apparatus, comprising:
a flash memory, comprising a write circuit and a memory cell array comprising a plurality of memory cells, wherein the write circuit is coupled to the memory cell array to write data in the memory cells; and
a flash memory controller, coupled to the write circuit, obtaining a total capacity and a user data amount of the flash memory, and when a ratio of the user data amount to the total capacity is less than a first predetermined value, directing the write circuit to perform data writing in a one-bit mode.

2. The flash memory apparatus as claimed in claim 1, wherein when the ratio is equal to or greater than the first predetermined value, the flash memory controller directs the write circuit to perform data writing in a two-bit mode.

3. The flash memory apparatus as claimed in claim 2, wherein the memory cells have a plurality of voltage operation ranges, and when the write circuit operates according to the two-bit mode, the voltage operation ranges with the lowest four voltage levels respectively represents two data bits (11, 10, 01, and 00).

4. The flash memory apparatus as claimed in claim 1, wherein when the ratio is equal to or greater than the first predetermined value, the flash memory controller directs the write circuit to perform data writing in a three-bit mode.

5. The flash memory apparatus as claimed in claim 1, wherein when the ratio is equal to or greater than the first predetermined value, and the ratio is less than a second predetermined value, the flash memory controller directs the write circuit to perform data writing in a two-bit mode.

6. The flash memory apparatus as claimed in claim 5, wherein when the ratio is equal to or greater than the second predetermined value, the flash memory controller directs the write circuit to perform data writing in a three-bit mode.

7. The flash memory apparatus as claimed in claim 5, wherein the first predetermined value is 30% and the second predetermined value is 60%.

8. The flash memory apparatus as claimed in claim 5, wherein the first predetermined value is ⅓ and the second predetermined value is ⅔.

9. The flash memory apparatus as claimed in claim 5, wherein the memory cells have a plurality of voltage operation ranges, and when the write circuit operates according to the two-bit mode, the voltage operation ranges with the lowest four voltage levels respectively represents two data bits (11, 10, 01, and 00).

10. The flash memory apparatus as claimed in claim 1, wherein the memory cells have a plurality of voltage operation ranges, and when the write circuit operates according to the one-bit mode, the voltage operation range with the lowest voltage level represents a data bit 1, and the voltage operation range with the second lowest voltage level represents a data bit 0.

11. The flash memory apparatus as claimed in claim 1, wherein the memory cells have a plurality of voltage operation ranges, and when the write circuit operates according to the one-bit mode, the voltage operation range with the lowest voltage level represents a data bit 1, and the voltage operation range with the third lowest voltage level represents a data bit 0.

12. The flash memory apparatus as claimed in claim 1, wherein the flash memory controller comprises a hot data table for determining whether the data to be written to the flash memory is hot data, and when the data is determined to be hot data, the write circuit is directed to perform data writing in the one-bit mode.

13. The flash memory apparatus as claimed in claim 12, wherein the flash memory controller selects a storage block from the memory cell array to store the hot data in the one-bit mode.

14. The flash memory apparatus as claimed in claim 12, wherein when the data is determined to be cold data, the write circuit is directed to perform data writing in a three-bit mode.

15. A method for controlling a flash memory apparatus, comprising:
   receiving data to be written to a flash memory;
   calculating a ratio of user data amount to total capacity of the flash memory; and
   when the ratio is less than a first predetermined value, directing a write circuit to perform data writing in a one-bit mode.

16. The method as claimed in claim 15, further comprising:
   when the ratio is greater than the first predetermined value, determining whether the ratio is less than a second predetermined value; and
   when the ratio is less than the second predetermined value, directing the write circuit to perform data writing in a two-bit mode.

17. The method as claimed in claim 16, further comprising:
   when the ratio is greater than or equal to the second predetermined value, directing the write circuit to perform data writing in a three-bit mode.

18. The method as claimed in claim 16, wherein the first predetermined value is 30%, and the second predetermined value is 60%.

19. The method as claimed in claim 16, wherein the first predetermined value is $\frac{1}{3}$, and the second predetermined value is $\frac{2}{3}$.

20. The method as claimed in claim 16, wherein the flash memory has a plurality of voltage operation ranges, and when the write circuit operates according to the two-bit mode, the voltage operation ranges with the lowest four voltage levels respectively represents two data bits (11, 10, 01, and 00).

21. The method as claimed in claim 15, further comprising:
   when the ratio is greater than or equal to the first predetermined value, directing the write circuit to perform data writing in a two-bit mode.

22. The method as claimed in claim 21, wherein the flash memory has a plurality of voltage operation ranges, and when the write circuit operates according to the two-bit mode, the voltage operation ranges with the lowest four voltage levels respectively represents two data bits (11, 10, 01, and 00).

23. The method as claimed in claim 15, further comprising:
   when the ratio is greater than or equal to the first predetermined value, directing the write circuit to perform data writing in a three-bit mode.

24. The method as claimed in claim 15, wherein the flash memory has a plurality of voltage operation ranges, and when the write circuit operates according to the one-bit mode, the voltage operation range with the lowest voltage level represents a data bit 1, and the voltage operation range with the second lowest voltage level represents a data bit 0.

25. The method as claimed in claim 15, wherein the flash memory has a plurality of voltage operation ranges, and when the write circuit operates according to the one-bit mode, the voltage operation range with the lowest voltage level represents a data bit 1, and the voltage operation range with the third lowest voltage level represents a data bit 0.

26. The method as claimed in claim 15, further comprising:
   when the data to be written to the flash memory is determined to be hot data, directing the write circuit to perform data writing in the one-bit mode.

* * * * *